United States Patent
Pope et al.

[19]

[11] Patent Number: 5,999,061
[45] Date of Patent: Dec. 7, 1999

[54] FIRST AND SECOND OSCILLATOR CIRCUITS SELECTIVELY COUPLED THROUGH PASSIVE OUTPUT CIRCUIT TO A LOAD

[75] Inventors: Matthew D. Pope, Aurora; Jeffrey T. Gudewicz, Denver, both of Colo.

[73] Assignee: Vari-L Company, Inc., Denver, Colo.

[21] Appl. No.: 09/304,651

[22] Filed: May 4, 1999

Related U.S. Application Data

[60] Provisional application No. 60/084,260, May 5, 1998.

[51] Int. Cl.$^6$ .................................. H03B 5/12; H03B 5/18
[52] U.S. Cl. ....................... 331/49; 331/74; 331/117 R; 331/179; 331/177 V
[58] Field of Search ..................... 331/46, 48, 49, 331/74, 117 R, 117 FE, 117 D, 177 R, 179, 177 V

[56] References Cited

U.S. PATENT DOCUMENTS 5,852,384  12/1998  Sakakura et al. ......................... 331/48
5,856,763   1/1999  Reeser et al. .

Primary Examiner—Siegfried H. Grimm
Attorney, Agent, or Firm—Ancel W. Lewis, Jr.

[57] ABSTRACT

An oscillator having two oscillation circuits with widely different frequencies with a common passive switched output circuit. Each oscillator circuit includes a transmission line inductive impedance between the oscillator output and ground. The inductive impedances are selected to be open at the operating frequency of the associated oscillator circuit and a short or a low impedance at the frequency of the other oscillator circuit. Each inductive impedance forms a portion of an impedance matching pad for the other oscillator circuit.

8 Claims, 1 Drawing Sheet

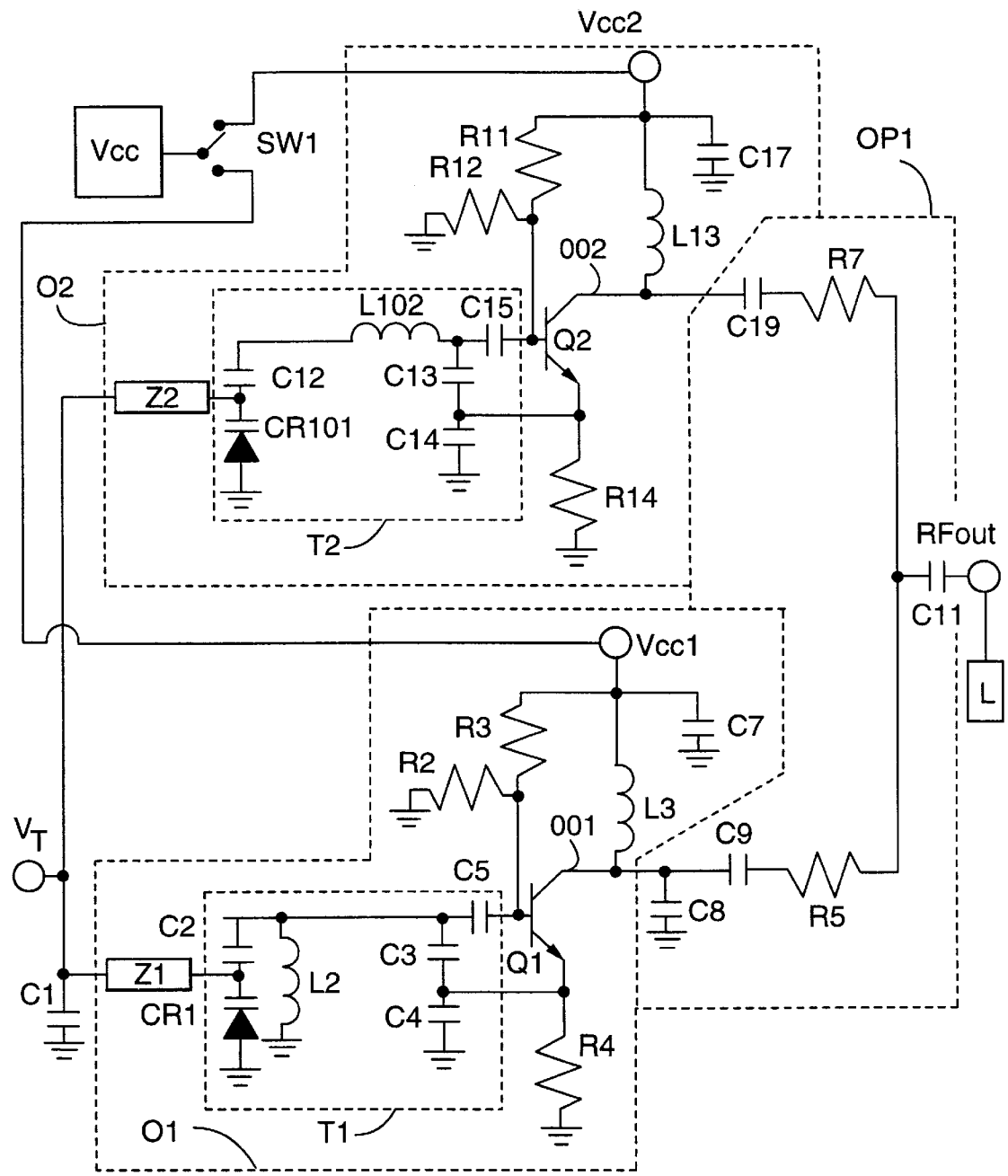

FIRST AND SECOND OSCILLATOR CIRCUITS SELECTIVELY COUPLED THROUGH PASSIVE OUTPUT CIRCUIT TO A LOAD

This application claims benefit of Provisional Application Ser. No. 60/084,260 May 5, 1998.

TECHNICAL FIELD

This invention relates to electronic oscillators and more particularly to an electronic oscillator having two voltage controlled oscillator circuits of different resonant frequencies with a common output circuit.

BACKGROUND ART

There are a great variety of wireless communication systems being used in the world today, such as Global System for Mobile Communication (GSM), Digital Advanced Mobile Phone Service (DAMPS), Personal Handy System (PHS), Personal Communication Services (PCS), Land Mobile Radio (LMR), Special Mobile Radio (SMR) and two way paging to name a few. The consumer would like their phone or pager to reliably work anywhere in the world, with any system architecture without costing them a small fortune. This desire has led mobile equipment manufacturers to offer dual mode and dual band models. Dual mode/band capabilities can accommodate the different modulation and data formatting protocols, as well as accommodate different frequencies required in various parts of the world. These features could allow the consumer to use a single phone in Europe (GSM) and the United States (PCS), a desirable situation in an increasingly smaller world.

Typically, the Voltage Controlled Oscillator (VCO) generates the Local Oscillator (LO) signal for transmit and receive functions in mobile radio RF circuitry. In dual band radios, a single VCO is desired to operate at two different frequencies to meet the requirements of two bands.

Prior art dual band devices have been implemented in the following ways: a single oscillator followed by a multiplier circuit, two separate oscillators with a switching network after the devices to select the appropriate oscillator, extremely wide band oscillators that operate over the entire frequency range, single oscillators that have a switched resonator in the tank circuit of the oscillator, a dual band oscillator with commonly connected emitters in which the bias is changed to turn on a first oscillator at a frequency then to transition to a second frequency as the second desired oscillation frequency, or two completely separate Voltage Controlled Oscillators (VCOs) that are matched then combined using a combiner network such as a Wilkinson Power Divider. U.S. Pat. No. 5,856,763 to Reeser et al. discloses a dual band oscillator with commonly connected emitters in which the bias is changed to turn on a first oscillator at a frequency then to transition to a second frequency as the second desired oscillation frequency.

The disadvantage of using a single oscillator with a multiplier circuit following the oscillator is the multiplier circuit requires current to function and the current drain may decrease the battery life of the device when used in a portable application. There are also harmonics of the fundamental frequency generated in addition to the desired frequency and these unwanted spurious signals may be a problem in the system and require extra filtering circuitry which will add cost and complexity.

The disadvantage of using two oscillators with an output switching network is each oscillator must be matched to the reference impedance of the system, typically 50 ohms for RF circuits in this frequency range, then the switching circuit must be implemented again adding complexity and parts to the device.

The disadvantage of using an extremely wide band oscillator is that to accomplish the wide tuning range a large capacitance change is required in the tank circuit. This large capacitance change requires a large voltage change applied to the variable capacitor (a varactor diode) which is unavailable in many applications and the circuit Q is degraded which increases the noise in the circuit rendering the oscillator unable to meet the phase noise requirements of the application.

The disadvantage of the switched resonator implementation is the resonator switch is typically implemented with a pin diode which requires significant current be applied to the device to achieve low "on" resistance. This degrades battery life in portable devices and the phase noise performance of the circuit is usually degraded due to the lower circuit Q achieved by implementing the pin diode in the tank circuit.

The disadvantage of using the dual band oscillator with the common coupled emitters is the output is typically taken from a common point between the two collectors or emitters which are coupled. This requires a matching network be synthesized to match the transistor output to the reference impedance of the system, again typically 50 ohms at these frequencies. This network may be complex since the network will pass the lower frequency and the higher frequency. Since the higher frequency is approximately twice the first frequency, a wide band output network should be used, and the second harmonic of the lower frequency oscillator will be within the passband and may be passed to the output creating unwanted spurious signal.

The disadvantage of using two different oscillators with a Wilkinson combiner is each individual oscillator must be matched to the reference impedance of the system, again typically 50 ohms in RF circuits, then the Wilkinson combiner is implemented. The Wilkinson combiner will be unbalanced when either oscillator is shut off providing unequal loads on the input of the combiner. This will alter the amplitude response of the combiner. One solution to this dilemma is to provide an amplifier to the output of the oscillator before the combiner. This results in extra current and circuitry requirements.

DISCLOSURE OF THE INVENTION

A dual band voltage controlled oscillator having two oscillator circuits with a frequency ratio of about 1.5 to 2.5 with a common passive switched output circuit is disclosed. The dual band oscillator is operated with only one of the oscillator circuits functioning at a time. The passive output switch circuit provides impedance matching of each oscillator at the operating frequency with attenuation of harmonic components of the lower band and no extra combining network. The output circuit includes two series connected resistors connected between the outputs of the oscillator circuits, and an output terminal connected between the resistors. The output terminal is connected to a load. Each oscillating circuit has a transmission line inductive impedance that connects from the oscillator output to an RF ground. Each inductive impedance is selected to be high impedance to a signal of the frequency of the oscillator circuit to which the inductive impedance is connected and a short or low impedance to a signal of the frequency of the other oscillator circuit. When one of the oscillator circuits is on, the two resistors, in combination with the inductive impedance associated with the other oscillator circuit, act as a minimum-loss L pad to match the impedance of the oscillator circuit and the load. The output circuit is passive, having no active components such as switches or transistors to switch between the oscillator circuits. The output circuit minimizes power loss. The output circuit eliminates the need for separate matching networks, and a combining network or switch, thereby reducing the number of circuit components required.

BRIEF DESCRIPTION OF THE DRAWINGS

Details of this invention are described in connection with the accompanying single drawing FIGURE which is an electronic circuit diagram of a voltage controlled oscillator with two oscillator circuits and a common output circuit embodying features of the present invention.

DETAILED DESCRIPTION OF THE INVENTION

Referring to the drawing, an electronic oscillator embodying features of this invention has a first oscillator circuit O1, a second oscillator circuit O2, and a passive switched output circuit OP1. The center frequency of the second oscillator circuit O2 preferably is about 1.5 to 2.5 times the center frequency of the first oscillator circuit O1.

The first oscillator circuit O1 is of the Colpitts type and is voltage controlled. Other types of oscillator, such as Pierce or Hartley, would be suitable for use in the invention. The first oscillator circuit O1 shown includes a parallel resonant tuned first tank circuit T1 having a first resonating inductor L2 connected in parallel with a first DC blocking capacitor C2 that is connected in series with a first tuning capacitor CR1, shown as a varactor diode. The first resonating inductor L2 is connected to ground on the side opposite the connection to first DC blocking capacitor C2. The first tuning capacitor CR1 is connected to ground on the side opposite the connection to first DC blocking capacitor C2. The first tank circuit T1 includes a first signal divider capacitor C3 connected to the connection of the first resonating inductor L1 and the first DC blocking capacitor C2 on one side, and connected to a second signal divider capacitor C4 on an opposite side. The side of second signal divider capacitor C4 opposite the connection to the first signal divider capacitor C3 is connected to ground.

A DC voltage tuning input terminal $V_T$ is connected through a first impedance Z1 to the connection of first tuning capacitor CR1 to first DC blocking capacitor C2 to tune the capacitance of first tuning capacitor CR1. First impedance Z1 is of a high value so as not to load the Q of the parallel tuned first tank circuit T1, and may be an RF choke, a high impedance active device such as a transistor, or another network presenting a high RF impedance and a controlled DC resistance. An RF bypass capacitor C1 is connected between input terminal $V_T$ and ground to provide a low pass filter and thereby short out any RF signals. Capacitor C1 is a low reactance at minimum oscillator frequencies and a high reactance at maximum anticipated modulation frequencies.

The first oscillator circuit O1 includes a first amplifying element, shown as NPN first transistor Q1. A DC voltage source $V_{cc}$ is connected through a switch SW1 to a first supply terminal $V_{cc1}$. The first supply terminal $V_{cc1}$ connects through a resistor R3 to the base of the first transistor Q1. The base of the first transistor Q1 is connected through a resistor R2 to ground. The first supply terminal $V_{cc1}$ is connected through inductive impedance L3 to the collector of first transistor Q1. The inductive impedance L3 is a transmission line such as a microstrip line or a stripline, and is about ¼ wavelength ($\lambda$) at the frequency of oscillation of the first oscillator circuit O1. The first supply terminal $V_{cc1}$ is connected through an RF bypass capacitor C7 to ground. The capacitor C7 is open to the DC voltage but provides a direct high frequency connection between inductive impedance L3 and ground.

The feedback loop for sustaining the oscillations in the first tank circuit T1 includes the first transistor Q1, the first signal divider capacitor C3, and a capacitor C5. The emitter of first transistor Q1 connects between signal divider capacitors C3 and C4. One side of the capacitor C5 connects to the base of the first transistor Q1 and the other side of capacitor C5 connects to the side of first signal divider capacitor C3 opposite the connection to the second signal divider capacitor C4. A feedback output impedance in the form of a resistor R4 is shown connected between the emitter of the first transistor Q1 and ground.

The second oscillator circuit O2 is shown generally as the Colpitts type and is voltage controlled. Other types of oscillator, such as Pierce or Hartley, would be suitable for use in the invention. The second oscillator circuit O2 includes a series tuned second tank circuit T2 that has an oscillation frequency that is in the range of 1.5 to 2.5 the oscillation frequency of the first tank circuit T1 of the first oscillation circuit O1. The second tank circuit T2 includes a second tuning capacitor CR101, shown as a varactor diode, a second DC blocking capacitor C12 and a second resonating inductor L102, a third signal divider capacitor C13 and a fourth signal divider capacitor C14 connected in series. The second tuning capacitor CR101 is connected to ground on the side opposite the connection to the second DC blocking capacitor C12. The side of second signal divider capacitor C14 opposite the connection to the first signal divider capacitor C13 is connected to ground.

The DC voltage tuning input terminal $V_T$ is connected through a second impedance Z2 to the connection of second tuning capacitor CR101 and second DC blocking capacitor C12 to tune the capacitance of second tuning capacitor CR101. The second impedance Z2 is of a high value so as not to load the Q of the second tank circuit T2, and may be an RF choke, a high impedance active device such as a transistor, or another network presenting a high RF impedance and a controlled DC resistance.

The second oscillator circuit O2 also includes an amplifying element, shown as NPN second transistor Q2. The DC voltage source $V_{cc}$ is connected through the switch SW1 to a second supply terminal $V_{cc2}$. The switch SW1 is connected so that the DC supply voltage is supplied to only one of first supply terminal $V_{cc1}$ or second supply terminal $V_{cc2}$ at any time. The circuit described above and shown in the drawing for selectively operating the first or second oscillation circuit O1 or O2 by selectively switching power between the collectors of first and second transistors Q1 and Q2 is by way of example and not limitation. Alternatively, other means for selectively operating the first or second oscillation circuit O1 or O2 may be provided, such as a switch that selectively switches power between the bases of first and second transistors Q1 and Q2.

The second supply terminal $V_{cc2}$ connects through a resistor R11 to the base of the second transistor Q2. The base of the second transistor Q2 is connected through a resistor R12 to ground. The second supply terminal $V_{cc2}$ is connected through inductive impedance L13 to the collector of second transistor Q2. The inductive impedance L13 is a transmission line such as a microstrip line or a stripline, and is about ¼ wavelength (λ) at the frequency of oscillation of the second oscillator circuit O2. The second supply terminal $V_{cc2}$ is connected through an RF bypass capacitor C17 to ground. The capacitor C17 is open to the DC voltage but provides a direct high frequency connection between inductive impedance L13 and ground.

The feedback loop for sustaining the oscillations in the second tank circuit T2 includes the second transistor Q2, the third signal divider capacitor C13, and a capacitor C15. The emitter of second transistor Q2 connects between signal divider capacitors C13 and C14. One side of the capacitor C15 connects to the base of the second transistor Q2 and the other side of capacitor C15 connects to the side of third signal divider capacitor C13 opposite the connection to the fourth signal divider capacitor C14. A feedback output impedance in the form of a resistor R14 is shown connected between the emitter of the first transistor Q1 and ground.

The first oscillator output OO1 of first oscillator circuit O1 is at the collector of first transistor Q1 and the second oscillator output OO2 of second oscillator circuit O2 is at the collector of second transistor Q2. The output circuit OP1 connects from the first oscillator output OO1 to the second oscillator output OO2, and includes series connected capacitor C9, resistor R5, resistor R7, and capacitor C19, respectively. A capacitor C8 connects from the first oscillator output OO1 to ground. One side of a capacitor C11 is connected between resistor R5 and resistor R7, and the opposite side of the capacitor C11 is connected to an output terminal $RF_{out}$. The output terminal $RF_{out}$ is shown connected to a load L.

By way of example, and not limitation, the table below lists exemplary values for the components of the above described circuit for a frequency of about 800 MHz for the first oscillator circuit O1 and a frequency of about 1900 MHz for the second oscillator circuit O2.

| Component | Value |
|---|---|
| C1 | 33 pf |
| C2 | 4 pf |
| C3 | 2 pf |
| C4 | 4 pf |
| C5 | 1 pf |
| C7 | 33 pf |
| C8 | 1 pf |
| C9 | 33 pf |
| C11 | 33 pf |
| C12 | 4 pf |
| C13 | 2 pf |
| C14 | 4 pf |
| C15 | 1 pf |
| C17 | 33 pf |
| C19 | 33 pf |
| CR1 | 18 pf |
| CR101 | 6 pf |
| L2 | 8 nH |
| L3 | ¼λ @800 MHz |
| L13 | ¼λ @1900 MHz |
| L102 | 4 nH |
| R2 | 2 kΩ |
| R3 | 2 kΩ |
| R4 | 180 Ω |
| R5 | 68 Ω |
| R7 | 68 Ω |
| R11 | 2 kΩ |
| R12 | 2 kΩ |
| R14 | 180 Ω |
| Z1 | 800 Ω |
| Z2 | 800 Ω |
| Vcc | 5 V |
| Vt | 0–8 V |

In the operation of the above described circuit, the first and second oscillators circuits O1 and O2 are utilized at different times and are selectively turned on by switching switch SW1 to connect the DC supply voltage to either first supply terminal $V_{cc1}$ or second supply terminal $V_{cc2}$. When the first oscillator circuit O1 is on, the output circuit OP1, in combination with the inductive impedance L13 and the capacitor C17, is a minimum-loss L pad type transforming pad for matching the output impedance of the first oscillator circuit O1 to the impedance of load L. Specifically, the transforming pad has a through leg including capacitor C9, resistor R5 and capacitor C11 connected in series from the first oscillator output OO1 to the output terminal $RF_{out}$. The transforming pad has a shunt leg including resistor R7, capacitor C19, inductive impedance L13 and capacitor C17 connected in series from the connection of resistor R5 and capacitor C11 to ground. Capacitor C8 connects between the first oscillator output OO1 and ground, and is a shunt to ground with an impedance greater than 100 ohms. The inductive impedance L3 is ¼ λ and therefore is high impedance at the frequency of oscillation of the first oscillator circuit O1. The second transistor Q2 is off and a high impedance.

The example values above are selected for an output impedance for first oscillator circuit O1 of about 100 Ω and an impedance for load L of about 50 Ω, so that the impedance ratio is 2:1. For a minimum-loss L pad with an impedance ratio of 2:1, the impedance of the through leg, between the first oscillator output OO1 and the connection of the shunt leg, is selected as about 1.414 times the impedance of load L, or about 70 Ω, and the impedance of the shunt leg is selected as about 1.414 times the impedance of load L, or about 70 Ω.

Capacitors C9, and C11 are DC blocking capacitors with approximately zero impedance at the operating frequency of the first oscillation circuit O1, so the impedance of the through leg is the impedance of resistor R5, or 68 Ω. Inductive impedance L13 is less than ⅛ wavelength and therefore low impedance, less than 20 Ω, at the oscillation frequency of the first oscillation circuit O1. Capacitors C17 and C19 are DC blocking capacitors with approximately zero impedance at the operating frequency of the first oscillation circuit O1, so the impedance of the shunt leg is the series impedance of resistor R7 and inductive impedance L13, or about 71 Ω.

When the second oscillator circuit O2 is on, the output circuit OP1, in combination with the inductive impedance L3 and the capacitor C7, is a minimum-loss L pad type transforming pad for matching the output impedance of the second oscillator circuit O2 to the impedance of load L. Specifically, the transforming pad has a through leg including capacitor C19, resistor R7 and capacitor C11 connected in series from the second oscillator output OO2 to the output terminal $RF_{out}$. The transforming pad has a shunt leg including resistor R5, capacitors C9, and C8 connected in series from the connection of resistor R7 and capacitor C11 to ground, and inductive impedance L3 and capacitor C7 connected in series from the connection of capacitor C9 and capacitor C8 to ground. Capacitor C8 has an impedance greater than 100 ohms. The inductive impedance L13 is ¼ λ and therefore is open at the frequency of oscillation of the second oscillator circuit O2. The first transistor Q1 is off and a high impedance.

The example values above are selected to provide an output impedance for second oscillator circuit O2 of about 100 Ω and an impedance of load L of about 50 Ω, so that the impedance ratio is 2:1. For a minimum-loss L pad with an impedance ratio of 2:1, the impedance of the through leg, between the second oscillator output OO2 and the connection of the shunt leg, is selected as about 1.414 times the impedance of load L, or about 70 Ω, and the impedance of the shunt leg is selected as about 1.414 times the impedance of load L, or about 70 Ω.

Capacitors C19, and C11 are DC blocking capacitors with approximately zero impedance at the operating frequency of the second oscillation circuit O2, so the impedance of the through leg is the impedance of resistor R7, or 68 Ω. Inductive impedance L3 is about ½ wavelength and therefore a short at the oscillation frequency of the second oscillation circuit O2. Capacitor C8 has an impedance of about 50 Ω at the oscillation frequency of the second oscillation circuit O2. Capacitors C7 and C9 are DC blocking capacitors with approximately zero impedance at the operating frequency of the second oscillation circuit O2. Since capacitor C8 is in parallel to ground with the series connected inductive impedance L3 and capacitor C7, the impedance of the shunt leg is the impedance of resistor R5, or 68 Ω.

The output circuit OP1 has no active components and is therefore a passive switched circuit. The output circuit OP1 requires fewer components than would be required for separate transforming for each oscillation circuit and a combining network. The output circuit OP1 is an efficient broad-band matching network.

Although the present invention has been described with a certain degree of particularity, it is understood that the present disclosure has been made by way of example and that changes in details of structure may be made without departing from the spirit thereof.

What is claimed is:

1. An electronic oscillator comprising:
   a first oscillator circuit having a first oscillator output and a first inductive impedance connected between said first oscillator output and an RF ground,
   a second oscillator circuit having a second oscillator output and a second inductive impedance connected between said second oscillator output and said RF ground, and
   a output circuit connected to said first oscillator output and to said second oscillator output, said output circuit including an output terminal connected to a load, said output circuit and said second inductive impedance forming a first transforming pad for said first oscillator circuit when said first oscillator circuit is operating to match the impedance of said first oscillator circuit to the impedance of said load, said output circuit and said first inductive impedance forming a second transforming pad for said second oscillator circuit when said second oscillator circuit is operating to match the impedance of said second oscillator circuit to the impedance of said load.

2. The oscillator as set forth in claim 1 wherein said first oscillator circuit has a first frequency of operation and said second oscillator circuit has a second frequency of operation that is about 1.5 to 2.5 times the first frequency,
   said first inductive impedance including a first transmission line having a length of ¼ wavelength at said first frequency and therefore substantially an open at said first frequency, said first transmission line therefore being a length of about ½ wavelength and substantially a short at said second frequency, and
   said second inductive impedance including a second transmission line having a length of ¼ wavelength at said second frequency and therefore substantially an open at said second frequency, said second transmission line therefore being a length of about ⅛ wavelength and a low impedance at said first frequency.

3. The oscillator as set forth in claim 1 wherein said output circuit includes a first resistor connected from said first oscillator output to said output terminal and a second resistor connected from said second oscillator output to said output terminal.

4. The oscillator as set forth in claim 3 wherein
   said first transforming pad is a minimum loss L pad having a first through leg and a first shunt leg, said first through leg connecting from said first oscillator output to said output terminal and including said first resistor, said first shunt leg connecting from said output terminal to ground and including said second resistor and said second inductive impedance, and
   said second transforming pad is a minimum loss L pad having a second through leg and a second shunt leg, said second through leg connecting from said second oscillator output to said output terminal and including said second resistor, said second shunt leg connecting from said output terminal to ground and including said first resistor and said first inductive impedance.

5. The oscillator as set forth in claim 1 further including a DC voltage source and a switch connected to said voltage source, said switch being connected to said first inductive impedance opposite said first oscillator output and to said second inductive impedance opposite said second oscillator output, said switch being movable for alternately supplying DC voltage to said first oscillator circuit and said second oscillator circuit.

6. The oscillator as set forth in claim 1 wherein said first oscillator circuit and said second oscillator circuit are Colpitts oscillator circuits.

7. The oscillator as set forth in claim 1 wherein said first oscillator circuit has a parallel tuned resonant tank and said second oscillator circuit has a series tuned resonant tank.

8. An electric oscillator comprising:
   a first oscillator circuit having a first oscillation frequency, and including a first oscillator output and a first inductive impedance connecting between said first oscillator output and ground, said first inductive impedance including a first transmission line having a one quarter wavelength length at said first oscillation frequency,
   a second oscillator circuit having a second oscillation frequency that is in the range of about 1.5 to 2.5 times the first oscillation frequency, said second oscillator circuit including a second oscillator output and a second inductive impedance connecting between said second oscillator output and ground, said second inductive impedance including a second transmission line having a one quarter wavelength length at said second oscillation frequency, and
   a passive switched output circuit having a first resistor, a second resistor and an output terminal, said first resistor having a first side that connects to said first oscillator output and said first inductive impedance and a second side that connects to said output terminal, said second resistor having a third side that connects to said second oscillator output and said second inductive impedance and a fourth side that connects to said output terminal, said output terminal connecting to a load,
   said output circuit with said second inductive impedance forming a first transforming pad for said first oscillator circuit when said first oscillator circuit is operating, to match the impedance of said first oscillator circuit to said load, said first transforming pad having a first through leg including said first resistor and a first shunt leg including said second resistor and said second inductive impedance with said second transmission line being about one eighth wavelength at said first oscillation frequency and therefore a low impedance, said output circuit with said first inductive impedance forming a second transforming pad for said second oscillator circuit when said second oscillator circuit is operating, to match the impedance of said second oscillator circuit to said load, said second transforming pad having a second through leg including said second resistor and a second shunt leg including said first resistor and said first inductive impedance with said first transmission line being about one half wavelength at said second oscillation frequency and therefore substantially a short.

* * * * *